(12) United States Patent
Koyama et al.

(10) Patent No.: US 8,199,454 B2
(45) Date of Patent: Jun. 12, 2012

(54) ELECTROSTATIC CHUCK AND SUBSTRATE TEMPERATURE ADJUSTING-FIXING DEVICE

(75) Inventors: Tomoaki Koyama, Nagano (JP); Koki Tamagawa, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 202 days.

(21) Appl. No.: 12/333,491

(22) Filed: Dec. 12, 2008

(65) Prior Publication Data

US 2009/0168291 A1 Jul. 2, 2009

(30) Foreign Application Priority Data

Dec. 26, 2007 (JP) ................. 2007-333867

(51) Int. Cl.
*H01L 21/683* (2006.01)
*H01T 23/00* (2006.01)
*H01G 7/02* (2006.01)
*H05F 3/00* (2006.01)

(52) U.S. Cl. ..................................... 361/234
(58) Field of Classification Search .................. 361/234
See application file for complete search history.

(56) References Cited

U.S. PATENT DOCUMENTS

| | | | | |
|---|---|---|---|---|
| 5,625,526 A | * | 4/1997 | Watanabe et al. | 361/234 |
| 5,777,838 A | * | 7/1998 | Tamagawa et al. | 361/234 |
| 6,608,745 B2 | * | 8/2003 | Tsuruta et al. | 361/234 |
| 7,072,165 B2 | * | 7/2006 | Kellerman et al. | 361/234 |
| 7,248,457 B2 | * | 7/2007 | Miyaji et al. | 361/234 |
| 2007/0109713 A1 | * | 5/2007 | Miyaji et al. | 361/234 |
| 2007/0217117 A1 | * | 9/2007 | Ohta et al. | 361/234 |
| 2009/0284893 A1 | * | 11/2009 | Ando et al. | 361/234 |

FOREIGN PATENT DOCUMENTS

| | | |
|---|---|---|
| JP | 06-216224 | 8/1994 |
| JP | 2000-317761 | 11/2000 |
| JP | 2005-033125 | * 11/2000 |
| JP | 2002-076105 | 3/2002 |
| JP | 2005-033125 | 2/2005 |
| JP | 2006-049357 | 2/2006 |

* cited by examiner

*Primary Examiner* — Jared Fureman
*Assistant Examiner* — Lucy Thomas
(74) *Attorney, Agent, or Firm* — Rankin, Hill & Clark LLP (57) ABSTRACT

There is provided an electrostatic chuck for placing an adsorption object or a base body having an electrostatic electrode embedded therein and generating a coulombic force between the adsorption object and the electrostatic electrode by applying a voltage to the electrostatic electrode so as to hold the adsorption object in an adsorption state, wherein the base body includes a upper surface of the base body opposed to the adsorption object and a protrusion portion provided in the upper surface of the base body so as to come into contact with the adsorption object, and wherein the protrusion portion is provided in a region except for an outer edge portion of the upper surface of the base body, and the outer edge portion is substantially formed in the same plane as that of the upper surface of the base body.

16 Claims, 6 Drawing Sheets

ELECTROSTATIC CHUCK AND SUBSTRATE TEMPERATURE ADJUSTING-FIXING DEVICE

BACKGROUND OF THE INVENTION

The present invention relates to an electrostatic chuck and a substrate temperature adjusting-fixing device, and more particularly, to an electrostatic chuck for adsorbing an adsorption object placed on a base body and a substrate temperature adjusting-fixing device.

In the past, a coating device (for example, a CVD device, a PVD device, and the like) or a plasma etching device used to manufacture a semiconductor unit such as an IC or an LSI has a stage for holding a substrate within a vacuum treatment chamber with high precision. As such a stage, for example, a substrate temperature adjusting-fixing device having an electrostatic chuck is proposed.

The substrate temperature adjusting-fixing device holds the substrate in an adsorption state by using the electrostatic chuck and controls a temperature of the substrate held in an adsorption state to be a predetermined temperature. An example of the electrostatic chuck includes a coulombic-force electrostatic chuck and a Johnsen-Rahbek-force electrostatic chuck. In the coulombic-force electrostatic chuck, a response of an adsorption force is excellent with respect to an application of a voltage. However, an application of a high voltage is required and a sufficient adsorption force cannot be obtained when a contact area between the electrostatic chuck and the substrate is not large. In the Johnsen-Rahbek-force electrostatic chuck, it is necessary to flow a current to the substrate, but it is possible to obtain the sufficient adsorption force even when the contact area between the electrostatic chuck and the substrate is small.

Figure 1:
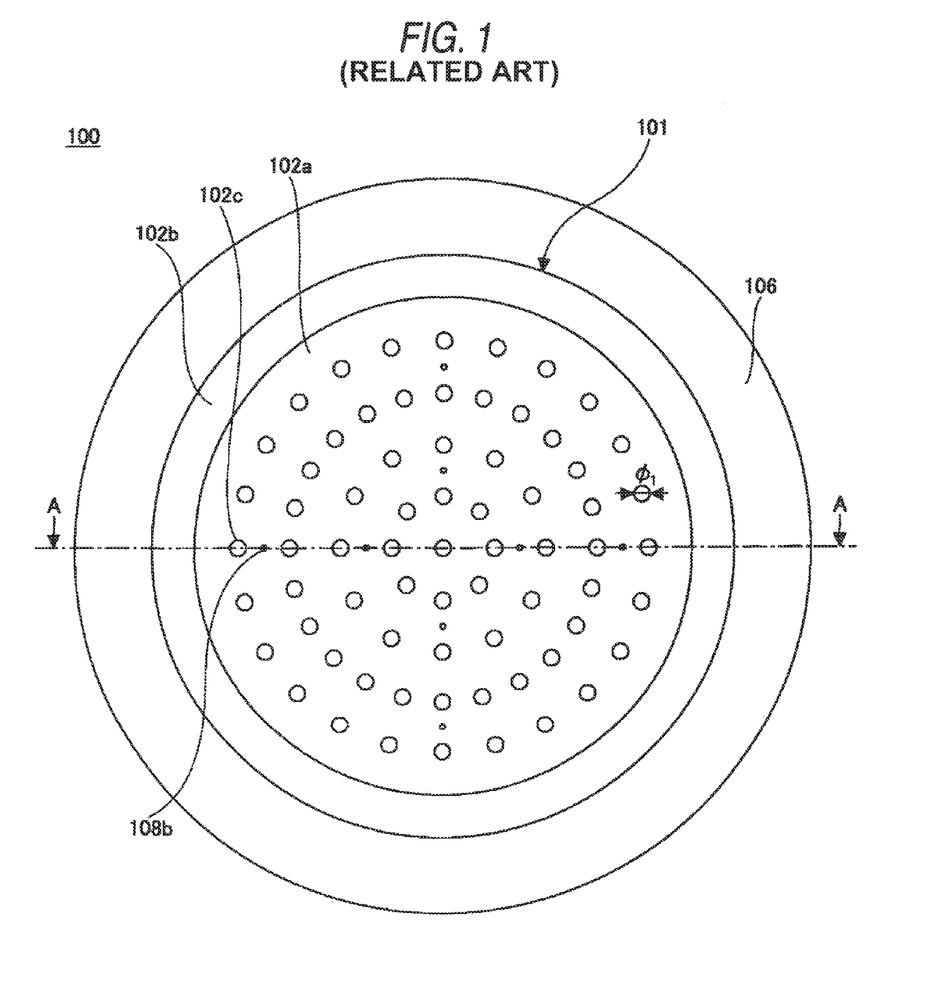
FIG. 1 is a top view simply showing a substrate temperature adjusting-fixing device 100 according to a conventional art.
Figure 2:
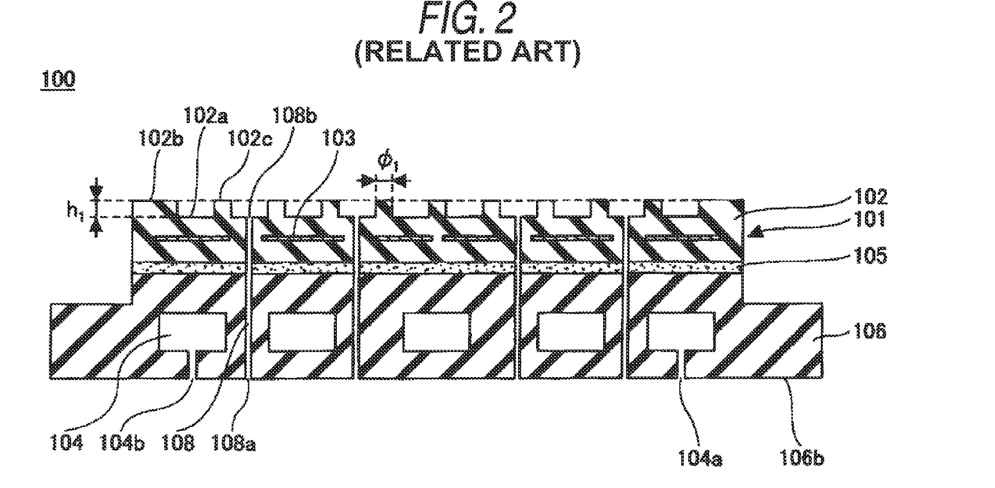
FIG. 2 is a cross sectional view simply showing the substrate temperature adjusting-fixing device 100 according to the conventional art when taken along the line A-A shown in FIG. 1.

FIG. 1 is a top view simply showing a substrate temperature adjusting-fixing device 100 according to a conventional art. FIG. 2 is a cross sectional view simply showing the substrate temperature adjusting-fixing device 100 according to the conventional art when taken along the line A-A shown in FIG. 1. As shown in FIGS. 1 and 2, the substrate temperature adjusting-fixing device 100 includes an electrostatic chuck 101, an adhesive layer 105, and a base plate 106. The electrostatic chuck 101 is a coulombic-force electrostatic chuck having a base body 102 and an electrostatic electrode 103. The base body 102 is fixed onto the base plate 106 via the adhesive layer 105. The base body 102 is formed of ceramic.

The outer edge portion of an upper surface 102a of the base body 102 is provided with an outer peripheral seal ring 102b corresponding to an annular protrusion portion in a top view. On the inside of the outer peripheral seal ring 102b in a top view, a plurality of cylindrical protrusion portions 102c is dotted in a polka-dot pattern in a top view. The heights $h_1$ of the upper surfaces of the outer peripheral seal ring 102b and the plurality of protrusion portions 102c are the same as each other, and the height $h_1$ may be, for example, in the range of 20 to 40 μm. The diameter $\phi_1$ of the upper surface of each protrusion portion 102c may be, for example, in the range of 1.0 to 2.0 mm.

The electrostatic electrode 103 is a thin-film electrostatic electrode and is embedded in the base body 102. The electrostatic electrode 103 is connected to a DC power source (not shown) provided in the outside of the substrate temperature adjusting-fixing device 100 and holds an adsorption object such as a substrate (not shown) in the upper surfaces of the outer peripheral seal ring 102b and the plurality of protrusion portions 102c in an adsorption state upon being applied with a predetermined voltage. The adsorbing-holding force becomes stronger as the voltage applied to the electrostatic electrode 103 becomes larger.

The base plate 106 is used to support the electrostatic chuck 101. The base plate 106 is provided with a heater (not shown) and a water path 104, thereby controlling a temperature of the base body 102. The heater (not shown) is heated upon being applied with a voltage and heats the base body 102 via the adhesive layer 105.

The water path 104 includes a cooling water introduction portion 104a and a cooling water discharge portion 104b formed in a lower surface 106b of the base plate 106. The cooling water introduction portion 104a and the cooling water discharge portion 104b are connected to a cooling water control device (not shown) provided in the outside of the substrate temperature adjusting-fixing device 100. The cooling water control device (not shown) introduces the cooling water from the cooling water introduction portion 104a into the water path 104 and discharges the cooling water from the cooling water discharge portion 104b. By circulating the cooling water to cool the base plate 106, the base body 102 is cooled via the adhesive layer 105.

A gas path 108 is formed through the base body 102, the adhesive layer 105, and the base plate 106. The gas path 108 includes a plurality of gas introduction portions 108a formed in the lower surface 106b of the base plate 106 and a plurality of gas discharge portions 108b formed in the upper surface 102a of the base body 102. The plurality of gas introduction portions 108a is connected to a pressure control device (not shown) provided in the outside of the substrate temperature adjusting-fixing device 100. The gas pressure control device (not shown) is capable of changing a pressure of an inert gas within a range, for example, 0 to 50 Torr and of introducing the inert gas from the gas introduction portion 108a to the gas path 108.

Figure 3:
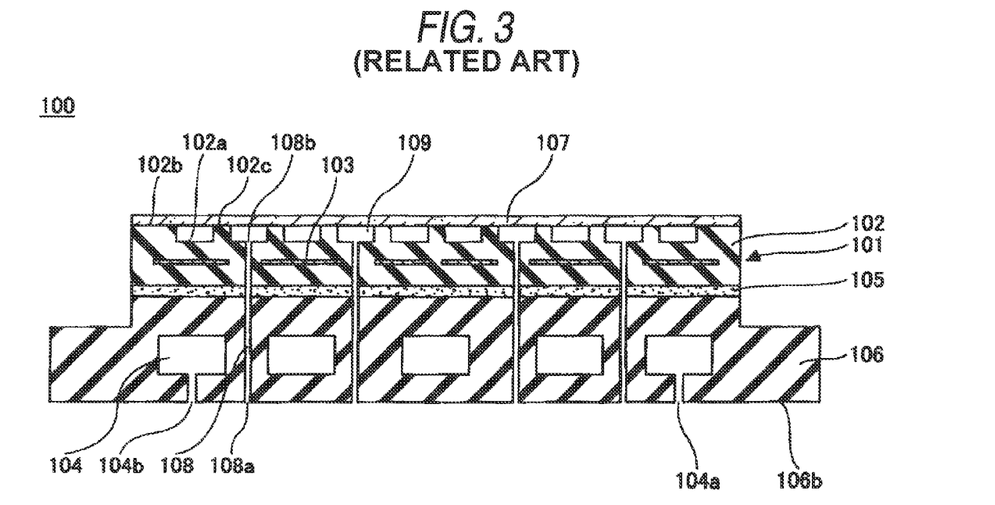
FIG. 3 is a cross sectional view simply showing a state where the substrate temperature adjusting-fixing device 100 according to the conventional art holds a substrate 107 in an adsorption state.

FIG. 3 is a cross sectional view simply showing a state where the substrate temperature adjusting-fixing device 100 according to the conventional art holds a substrate 107 in an adsorption state. In the same drawing, the same reference numerals are given to the same components as those of FIGS. 1 and 2, and the description thereof will be omitted. In FIG. 3, Reference numeral 107 denotes a substrate and Reference numeral 109 denotes a gas filling portion into which the inert gas is filled. As shown in FIG. 3, the substrate 107 is held in the upper surfaces of the plurality of protrusion portion 102c and the outer peripheral seal ring 102b of the base body 102. A temperature of the substrate 107 is controlled by the heater (not shown) or the water path 104 embedded in the base plate 106.

The gas pressure control device (not shown) introduces the inert gas from the plurality of gas introduction portions 108a to the gas path 108. When the introduced inert gas is discharged from the gas discharge portions 108b and is filled into the gas filling portion 109 corresponding to a space formed between the substrate 107 and the upper surface 102a of the base body 102, the heat conductivity between the base body 102 and the substrate 107 is improved. The outer peripheral seal ring 102b is provided to prevent the inert gas filled in the gas filling portion 109 from leaking to the outside of the gas filling portion 109.

As described above, the substrate temperature adjusting-fixing device 100 according to the conventional art holds the substrate 107 in the upper surfaces of the plurality of protrusion portions 102c and the outer peripheral seal ring 102b of the base body 102 of the electrostatic chuck 101 in an adsorption state. Additionally, the outer peripheral seal ring 102b as the annular protrusion portion in a top view provided in the outer edge portion of the upper surface 102a of the base body 102 of the substrate temperature adjusting-fixing device 100 according to the conventional art prevents the inert gas filled in the gas filling portion 109 from leaking to the outside of the gas filling portion 109 in order to improve the heat conductivity between the base body 102 and the substrate 107. Additionally, the heater (not shown) or the water path 104 embedded in the base plate 106 of the substrate temperature adjusting-fixing device 100 according to the conventional art controls the temperature of the substrate 107 (for example, see Patent Document 1).

As another example of the substrate temperature adjusting-fixing device according to the conventional art, there is proposed a substrate temperature adjusting-fixing device having a Johnsen-Rahbek-force electrostatic chuck, in which the outer peripheral seal ring 102b as the annular protrusion portion in a top view is provided in the outer edge portion of the upper surface 102a of the base body 102, and the plurality of cylindrical protrusion portions 102c is dotted in a polka-dot pattern in a top view on the inside of the outer peripheral seal ring 102b in a top view in the same manner as the substrate temperature adjusting-fixing device 100 shown in FIG. 1 so that the diameter $\phi_1$ of the upper surface of the plurality of protrusion portions 102c is set as small as possible and hence the contact area between the substrate 107 and the upper surface of the plurality of protrusion portions 102c is made to be small (for example, see Patent Document 2).

[Patent Document 1] JP-A-2000-317761
[Patent Document 2] JP-A-2005-33125

However, in the substrate temperature adjusting-fixing device 100 according to the conventional art, since the contact area between the substrate 107 and the upper surfaces of the plurality of protrusion portions 102c and the outer peripheral seal ring 102b is large, a problem arises in that particles are easily attached to an opposite surface of the substrate 107 contacting with the upper surfaces of the plurality of protrusion portions 102c and the outer peripheral seal ring 102b.

As disclosed in Patent Document 2, although it is possible to reduce the particles attached to the opposite surface of the substrate 107 at a portion contacting with the upper surface of the plurality of protrusion portions 102c in such a manner that the diameter $\phi_1$ of the upper surface of the plurality of protrusion portions 102c provided in the upper surface 102a of the base body 102 is set as small as possible to decrease the contact area between the substrate 107 and the upper surface of the plurality of protrusion portions 102c, it is observed that most of particles are attached to the opposite surface of the substrate 107 at a portion contacting with the upper surface of the outer peripheral seal ring 102b. As a result, it is not possible to solve the problem that the particles are easily attached to the opposite surface of the substrate 107 just by making the diameter $\phi_1$ of the upper surface of the plurality of protrusion portions 102c as small as possible.

SUMMARY OF THE INVENTION

The present invention is contrived in consideration of the above-described problems, and an object of the invention is to provide an electrostatic chuck capable of reducing particles attached to an opposite surface of an adsorption object held by the electrostatic chuck in an adsorption state and a substrate temperature adjusting-fixing device having the electrostatic chuck.

In order to achieve the above-described object, according to a first aspect of the invention, there is provided an electrostatic chuck including:

a base body, and an electrostatic electrode embedded in the base body, wherein an adsorption object is placed on the base body, a coulombic force is generated between the adsorption object and the electrostatic electrode by applying a voltage to the electrostatic electrode so as to hold the adsorption object in an adsorption state, the base body includes: an upper surface of the base body opposed to the adsorption object and a protrusion portion provided in the upper surface of the base body so as to come into contact with the adsorption object, the protrusion portion is provided in a region except for an outer edge portion of the upper surface of the base body, and the outer edge portion is substantially formed in the same plane as that of the upper surface of the base body.

According to a second aspect of the invention, there is provided the electrostatic chuck according to the first aspect, wherein the protrusion portion is provided so as to be dotted in a polka-dot pattern in a top view.

According to a third aspect of the invention, there is provided the electrostatic chuck according to the first or second aspect, wherein when the adsorption object is held in an adsorption state, an outer edge portion of a lower surface of the adsorption object closely contacts with the outer edge portion of the upper surface of the base body by the coulombic force.

According to a forth aspect of the invention, there is provided the electrostatic chuck according to any one of the first to third aspects, wherein an inert gas of which a pressure is adjusted is filled into a space formed between a lower surface of the adsorption object held in an adsorption state and the upper surface of the base body.

According to a fifth aspect of the invention, there is provided a substrate temperature adjusting-fixing device including:

the electrostatic chuck according to any one of the first to forth aspects, and a base plate for supporting the electrostatic chuck.

According to a sixth aspect of the invention, there is provided the substrate temperature adjusting-fixing device according to the fifth aspect, wherein the base plate includes:

a gas path embedded therein so as to introduce the inert gas into the electrostatic chuck, a heater embedded therein so as to heat the electrostatic chuck, and a water path embedded therein so as to cool the electrostatic chuck.

According to the invention, it is possible to provide an electrostatic chuck capable of reducing particles attached to an opposite surface of an adsorption object held by the electrostatic chuck in an adsorption state and a substrate temperature adjusting-fixing device having the electrostatic chuck.

DETAILED DESCRIPTION OF THE PREFERRED EMBODIMENTS

Hereinafter, an exemplary embodiment of the invention will be described with reference to the accompanying drawings.

Figure 4:
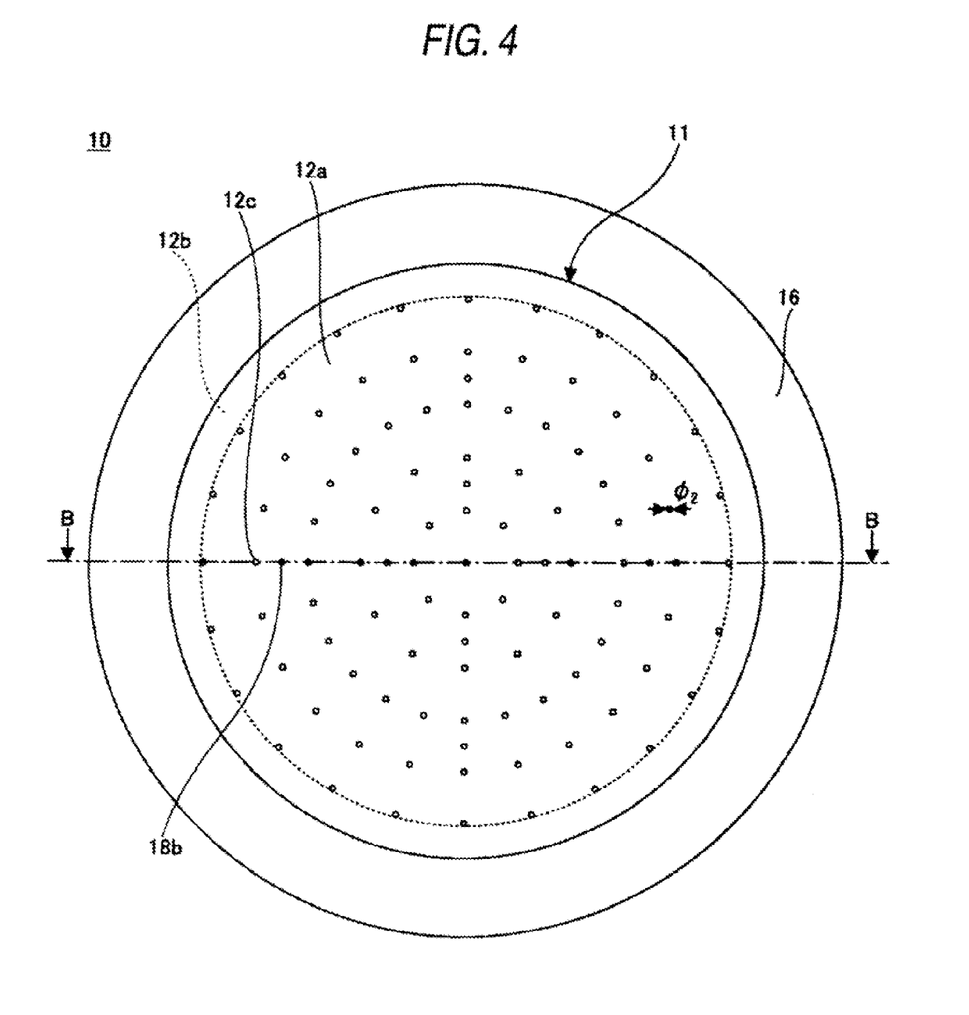
FIG. 4 is a top view simply showing a substrate temperature adjusting-fixing device 10 according to the invention.
Figure 5:
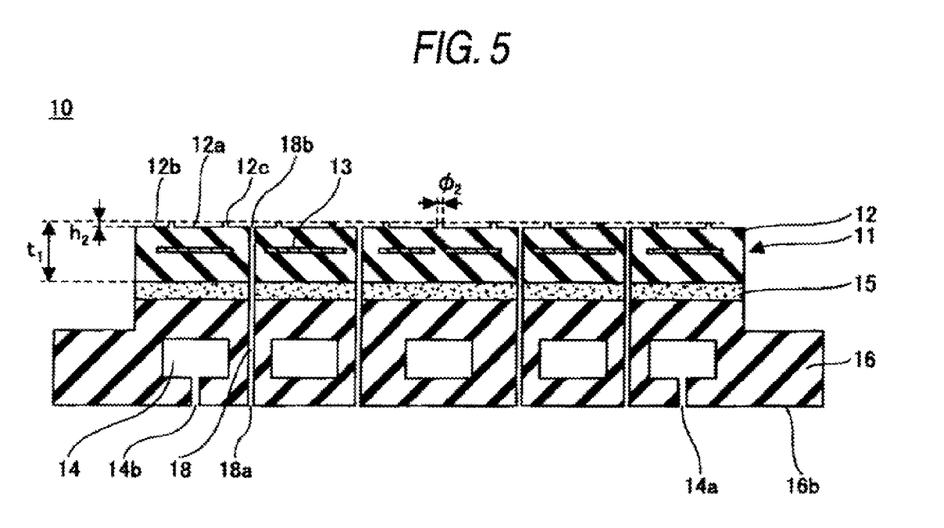
FIG. 5 is a cross sectional view simply showing the substrate temperature adjusting-fixing device 10 according to the invention when taken along the line B-B shown in FIG. 4.

FIG. 4 is a top vies simply showing a substrate temperature adjusting-fixing device 10 according to the invention. FIG. 5 is a cross sectional view simply showing the substrate temperature adjusting-fixing device 10 according to the invention when taken along the line B-B shown in FIG. 4. As shown in FIGS. 4 and 5, the substrate temperature adjusting-fixing device 10 includes an electrostatic chuck 11, an adhesive layer 15, and a base plate 16.

The electrostatic chuck 11 is a coulombic-force electrostatic chuck having a base body 12 and an electrostatic electrode 13. The base body 12 is a dielectric and is fixed onto the base plate 16 via the adhesive layer 15. As the base body 12, for example, ceramic or the like may be used, but all materials may be used so long as the dielectric may have a plurality of protrusion portions 12c described below. A thickness $t_1$ of the base body 12 may be, for example, in the range of 200 to 400 μm, a specific permittivity (1 KHz) of the base body 12 may be, for example, in the range of 9 to 10, and a volume resistance rate of the base body 12 may be, for example, in the range of $10^{12}$ to $10^{16}$ Ωm.

Reference numeral 12a denotes the upper surface of the base body 12, and Reference numeral 12b denotes the outer edge portion of the upper surface 12a of the base body 12. In the substrate temperature adjusting-fixing device 100 according to the conventional art, the outer peripheral seal ring 102b is provided in the outer edge portion 12b, but in the substrate temperature adjusting-fixing device 10 according to the invention, the outer peripheral seal ring 102b is not provided in the outer edge portion 12b.

As shown in FIGS. 4 and 5, the base body 12 includes the upper surface 12a which is opposed to an adsorption object (not shown) and the protrusion portions 12c which is provided in the upper surface 12a so as to come into contact with the adsorption object (not shown), in which the protrusion portions 12c are formed in a region except for the outer edge portion 12b of the upper surface 12a of the base body 12, and the outer edge portion 12b is substantially formed in the same plane as that of the upper surface 12a of the base body 12. Each protrusion portion 12c is formed into a cylindrical shape, and the plurality of protrusion portions 12c is formed in a region except for the outer edge portion 12b of the upper surface 12a of the base body 12 so as to be dotted in a polka-dot pattern in a top view.

A height $h_2$ of the upper surface of the plurality of protrusion portions 12c is the substantially same, and the height $h_2$ may be, for example, in the range of 3 to 5 μm. A diameter $\phi_2$ of the upper surface of the protrusion portion 12c may be, for example, in the range of 0.1 to 0.2 mm. The protrusion portion 12c may be formed into an oval shape in a top view, a polygonal shape such as a hexagonal shape in a top view, a shape in which a plurality of cylinders having different diameters is combined, or a combination thereof instead of the cylindrical shape (a circular shape in a top view). Additionally, the protrusion portion 12c has "the polka-dot pattern in a top view" in this specification, including the other shapes instead of the cylindrical shape (the circular shape in a top view).

The protrusion portion 12c is formed by, for example, sandblasting. Specifically, a portion where the protrusion portion 12c needs to be formed in the upper surface 12a of the base body 12 is subjected to masking, minute particles are implanted into the upper surface 12a of the base body 12 in terms of a gas pressure, and then a portion not being subjected to the masking is cut. A ratio (hereinafter, referred to as "a contact area ratio") between the sum of the area of the upper surface of the plurality of protrusion portions 12c and the whole area of the upper surface 12a of the base body 12 including portions having the plurality of protrusion portions 12c formed therein may be, for example, in the range of 0.005 to 0.03%. Additionally, the protrusion portions 12c may be arranged in accordance with any regularity so long as the protrusion portions 12c are substantially uniformly provided in the upper surface 12a of the base body 12.

The electrostatic electrode 13 is a thin-film electrode and is embedded in the base body 12. The electrostatic electrode 13 is connected to a DC power source (not shown) provided in the outside of the substrate temperature adjusting-fixing device 10 and adsorptively holds the adsorption object (not shown) in the upper surface of the plurality of protrusion portions 12c by generating a coulombic force between the adsorption object (not shown) such as a substrate and the electrostatic electrode upon being applied with a predetermined voltage. The adsorbing-holding force becomes stronger as the voltage applied to the electrostatic electrode 13 becomes larger. The electrostatic electrode 13 may be formed into a unipolar shape or a bipolar shape. As a material of the electrostatic electrode 13, for example, tungsten or the like may be used.

The adhesive layer 15 is provided to fix the base body 12 onto the base plate 16. As the adhesive layer 15, for example, silicon adhesive or the like having good heat conductivity may be used.

The base plate 16 is used to support the electrostatic chuck 11. The base plate 16 includes a heater (not shown) and a water path 14, thereby controlling the temperature of the base body 12. As a material of the base plate 16, for example, Al may be used. The heater (not shown) is heated upon being applied with a voltage and heats the base body 12 via the adhesive layer 15.

The water path 14 includes a cooling water introduction portion 14a and a cooling water discharge portion 14b formed in a lower surface 16b of the base plate 16. The cooling water introduction portion 14a and the cooling water discharge portion 14b are connected to a cooling water control device (not shown) provided in the outside of the substrate temperature adjusting-fixing device 10. The cooling water control device (not shown) introduces the cooling water from the cooling water introduce portion 14a into the water path 14 and discharges the cooling water from the cooling water discharge portion 14b. By circulating the cooling water to cool the base plate 16, the base body 12 is cooled via the adhesive layer 15.

A gas path 18 is formed through the base body 12, the adhesive layer 15, and the base plate 16. The gas path 18 includes a plurality of gas introduction portions 18a formed in the lower surface 16b of the base plate 16 and a plurality of gas discharge portions 18b formed in the upper surface 12a of the base body 12. The plurality of gas introduction portions 18a is connected to a pressure control device (not shown) provided in the outside of the substrate temperature adjusting-fixing device 10. The gas pressure control device (not shown) is capable of changing a pressure of an inert gas within a range, for example, 0 to 50 Torr and of introducing the inert gas from the gas introduction portion 18a to the gas path 18.

Figure 6:
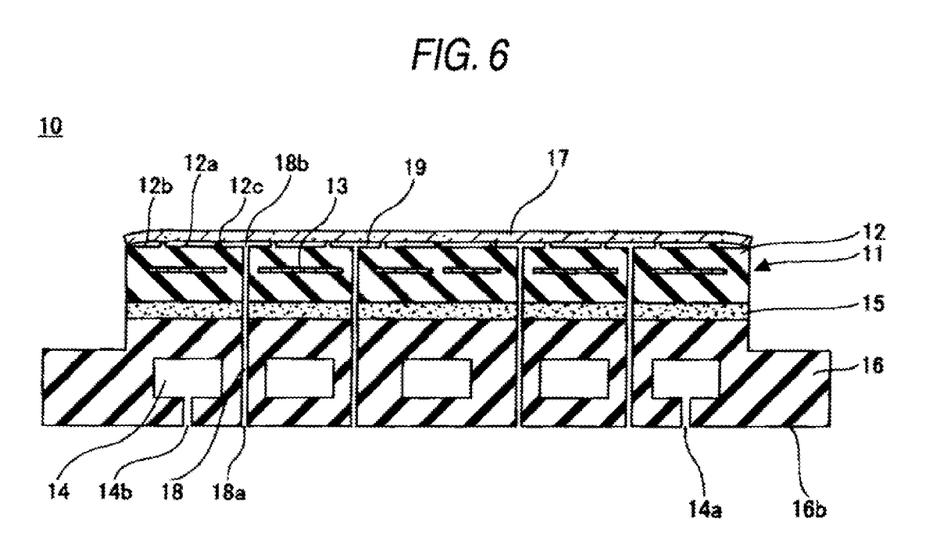
FIG. 6 is a cross sectional view simply showing a state where the substrate temperature adjusting-fixing device 10 holds a substrate 17 in an adsorption state.

FIG. 6 is a cross sectional view simply showing a state where the substrate temperature adjusting-fixing device 10 according to the invention holds a substrate 17 in an adsorption state. In the same drawing, the same reference numerals are given to the same components as those of FIGS. 4 and 5, and the description thereof will be omitted. In FIG. 6, Reference numeral 17 denotes a substrate and Reference numeral 19 denotes a gas filling portion into which the inert gas is filled. As shown in FIG. 6, the substrate 17 is held in the upper surface of the plurality of protrusion portions 12c in an adsorption state. A temperature of the substrate 17 is controlled by the heater (not shown) or the water path 14 provided in the base plate 16. The substrate 17 is, for example, a silicon wafer or the like. A thickness of the substrate 17 is, for example, in the range of 700 μm to 1,000 μm. In terms of the shape and the dimension of the protrusion portion 12c, the invention is applicable to the substrate having a different thickness.

The gas pressure control device (not shown) introduces the inert gas from the plurality of gas introduction portions 18a to the gas path 18. When the introduced inert gas is discharged from the gas discharge portions 18b and is filled into the gas filling portion 19 corresponding to a space formed between the lower surface of the substrate 17 and the upper surface 12a of the base body 12, the heat conductivity between the base body 12 and the substrate 17 is improved. As the inert gas, for example, He or Ar may be used.

In the substrate temperature adjusting-fixing device 100 according to the conventional art, the outer peripheral seal ring 102b is provided in the outer edge portion 12b, and the outer peripheral seal ring 102b prevents the inert gas from leaking to the outside of the gas filling portion 19. In the substrate temperature adjusting-fixing device 10 according to the invention, the outer peripheral seal ring 102b is not provided in the outer edge portion 12b, but the inert gas does not leak from the gas filling portion 19.

This is because of the following reasons. Although the substrate 17 is held in the upper surface of the plurality of protrusion portions 12c, in the substrate temperature adjusting-fixing device 10 according to the invention, the height $h_2$ of the plurality of protrusion portions 12c is as low as, for example, 3 to 5 μm and a distance from the upper surface of the plurality of protrusion portions 12c to the electrostatic electrode 13 becomes shorter than that of the substrate temperature adjusting-fixing device 100 according to the conventional art, thereby making the adsorption force (coulombic force) stronger. When the substrate 17 is held in the upper surface of the plurality protrusion portions 12c in an adsorption state, the outer edge portion of the substrate 17 is bent, and the outer edge portion of the lower surface of the substrate 17 closely contacts with the outer edge portion 12b of the upper surface 12a of the base body 12. Additionally, in FIG. 6, the bending of the outer edge portion of the substrate 17 is exaggeratingly depicted, but the actual bending is very small in the range of 3 to 5 μm or so, which does not cause any problem in a practical usage.

Table 1 shows a leakage amount of He when the gas pressure control device provided in the outside of the substrate temperature adjusting-fixing devices 10 and 100 fills He as the inert gas into the gas filling portion 109 of the substrate temperature adjusting-fixing device 100 according to the conventional art and the gas filling portion 19 of the substrate temperature adjusting-fixing device 10 according to the invention by changing a pressure of He to 20 Torr, 30 Torr, 40 Torr, and 50 Torr and by changing a DC voltage value applied to the electrostatic electrodes 103 and 13.

The leakage amount of He is measured in the substrate temperature adjusting-fixing device 100 according to the conventional art with 1.0 mm of the diameter $\phi_1$ of the upper surface of the protrusion portion 102c, 10 μm of the height $h_1$, and 6.4% of the contact area ratio and the substrate temperature adjusting-fixing device 10 according to the invention with 0.1 mm of the diameter $\phi_2$ of the upper surface of the protrusion portion 12c, 5 μm of the height $h_2$, and 0.007% of the contact area ratio. It is proved that the leakage of He does not occur at 5 sccm or less. Additionally, 60 sccm indicates a state where the substrate 107 or 17 is separated from the electrostatic chuck 101 or 11.

TABLE 1

| | He pressure | | | | | | | |
|---|---|---|---|---|---|---|---|---|
| | SUBSTRATE TEMPERATURE ADJUSTING-FIXING DEVICE 100 ACCORDING TO CONVENTIONAL ART | | | | SUBSTRATE TEMPEATURE ADJUSTING-FIXING DEVICE 10 ACCORDING TO THE INVENTION | | | |
| DC VOLTAGE | 20 Torr | 30 Torr | 40 Torr | 50 Torr | 20 Torr | 30 Torr | 40 Torr | 50 Torr |
| 1500 V | | | | | 60.0 sccm | | | |
| 2000 V | 60.0 sccm | | | | 30.3 sccm | | | |
| 2500 V | 3.3 sccm | 60.0 sccm | | | 0.0 sccm | 60.0 sccm | | |
| 3000 V | 2.8 sccm | 5.6 sccm | | | 0.1 sccm | 0.1 sccm | 60.0 sccm | |
| 3500 V | 2.6 sccm | 3.1 sccm | 60.0 sccm | | 0.0 sccm | 0.0 sccm | 0.1 sccm | 60.0 sccm |
| 4000 V | 2.6 sccm | 2.9 sccm | 5.0 sccm | 60.0 sccm | 0.0 sccm | 0.0 sccm | 0.0 sccm | 0.2 sccm |

As shown in Table 1, although the substrate temperature adjusting-fixing device 10 according to the invention is not provided with the outer peripheral seal ring 102b at the outer edge portion 12b, the leakage amount of He is the same or less than that of the substrate temperature adjusting-fixing device 100 according to the conventional art. That is, although the substrate temperature adjusting-fixing device 10 according to the invention is not provided with the outer peripheral seal ring 102b at the outer edge portion 12b, it is proved that the adsorption force is substantially the same as that of the substrate temperature adjusting-fixing device 100 according to the conventional art.

This is because the outer edge portion of the substrate 17 is bent and the outer edge portion of the lower surface of the substrate 17 closely contacts with the outer edge portion 12b of the upper surface 12a of the base body 12 when the substrate 17 is held in the upper surface of the plurality of protrusion portions 12c in an adsorption state as described above. In other words, in the substrate temperature adjusting-fixing device 10 according to the invention, the outer edge portion of the lower surface of the substrate 17 exhibits the same function as the outer peripheral seal ring 102b.

Likewise, with the substrate temperature adjusting-fixing device 10 according to the invention, since the height $h_2$ of the plurality of protrusion portions 12c is very low, for example, in the range of 3 to 5 µm, and the distance from the upper surface of the plurality of protrusion portions 12c to the electrostatic electrode 13 is shorter than that of the substrate temperature adjusting-fixing device 100 according to the conventional art, it is possible to make the adsorption force (coulombic force) stronger and thus to improve the close-contact degree between the substrate 17 and the plurality of protrusion portions 12c.

Additionally, since the outer edge portion of the substrate 17 is bent and the outer edge portion of the lower surface of the substrate 17 closely contacts with the outer edge portion 12b of the upper surface 12a of the base body 12 when the substrate 17 is held in the upper surface of the plurality of protrusion portions 12c in an adsorption state, it is possible to prevent a deterioration of a vacuum degree within a vacuum treatment chamber caused by the inert gas leaking to the outside of the gas filling portion 19.

As shown in Table 1, in the substrate temperature adjusting-fixing device 100 according to the conventional art, when the pressure of He filled into the gas filling portion 109 is, for example, 40 Torr, the leakage of He cannot be within an allowable range (5 sccm or less) if a DC voltage of 4,000 v is not applied to the electrostatic electrode 103. However, in the substrate temperature adjusting-fixing device 10 according to the invention, when the pressure of He filled into the gas filling portion 19 is, for example, 40 Torr, the leakage of He can be within the allowable range (5 sccm or less) if a DC voltage of 3,500 v is applied to the electrostatic electrode 13.

This is because the substrate temperature adjusting-fixing device 10 according to the invention has a configuration in which the height $h_2$ of the plurality of protrusion portions 12c is very low, for example, in the range of 3 to 5 µm and the distance from the upper surface of the plurality of protrusion portions 12c to the electrostatic electrode 13 is shorter than that of the substrate temperature adjusting-fixing device 100 according to the conventional art, thereby obtaining the large adsorption force (coulombic force) even when the voltage applied to the electrostatic electrode 13 is lower than that of the conventional art and improving the close-contact degree.

Likewise, with the substrate temperature adjusting-fixing device 10 according to the invention, since the large adsorption force (coulombic force) is obtained even when the voltage applied to the electrostatic electrode 13 is lower than that of the conventional art, it is possible to improve the close-contact degree. As a result, since it is not necessary to set the voltage applied to the electrostatic electrode 13 to be a large value, it is possible to prevent the deterioration of the substrate 17 by avoiding an occurrence of arcing or charge up of the substrate 17.

Additionally, since the substrate temperature adjusting-fixing device 100 according to the conventional art has a configuration in which the contact area between the substrate 107 and the upper surfaces of the outer peripheral seal ring 102b and the plurality of protrusion portions 102c is large, particles may be easily attached to the opposite surface of the substrate 107 contacting with the upper surfaces of the plurality of protrusion portions 102c and the outer peripheral seal ring 102b. However, since the substrate temperature adjusting-fixing device 10 according to the invention has a configuration in which the outer peripheral seal ring 102b is not provided, the diameter $\phi_2$ of the upper surface of the plurality of protrusion portions 12c is very small, for example, in the range of 0.1 to 0.2 mm, and the contact area between the upper surface of the plurality of protrusion portions 12c and the substrate 17 is small, it is possible to remarkably reduce the particles attached to the opposite surface of the substrate 17.

The reduction of the particles will be described in more detail with reference to FIGS. 7 and 8. For the convenience of the description, FIGS. 1 and 4 simply show the substrate temperature adjusting-fixing device by enlarging the diameter of the upper surface of the protrusion portion and decreasing the density of the protrusion portions, but FIG. 7 shows the actual substrate temperature adjusting-fixing device.

Figure 7A:
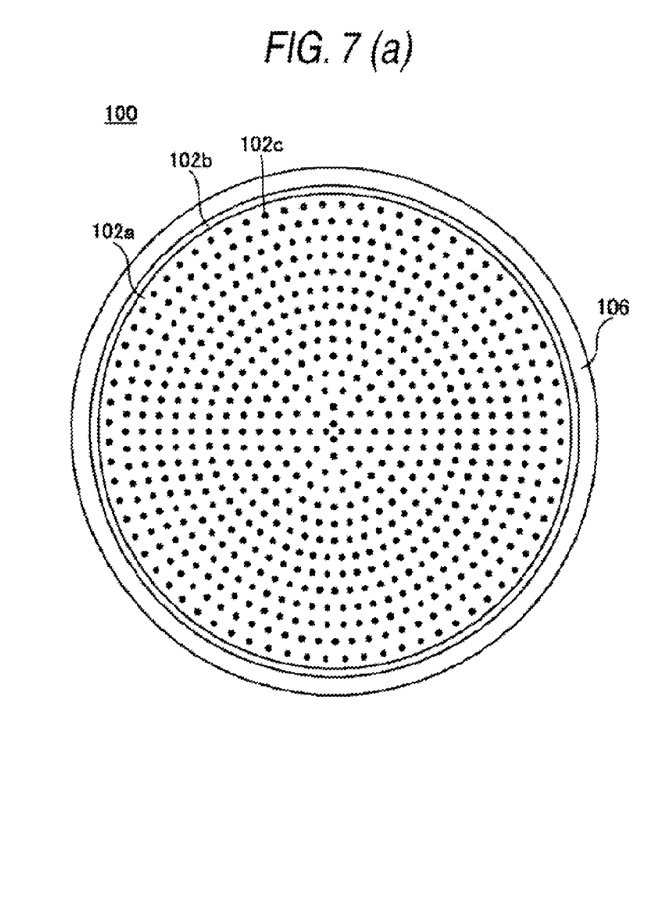
FIGS. 7(a) and 7(b) are top views showing the substrate temperature adjusting-fixing devices 100 and 10.
Figure 7B:
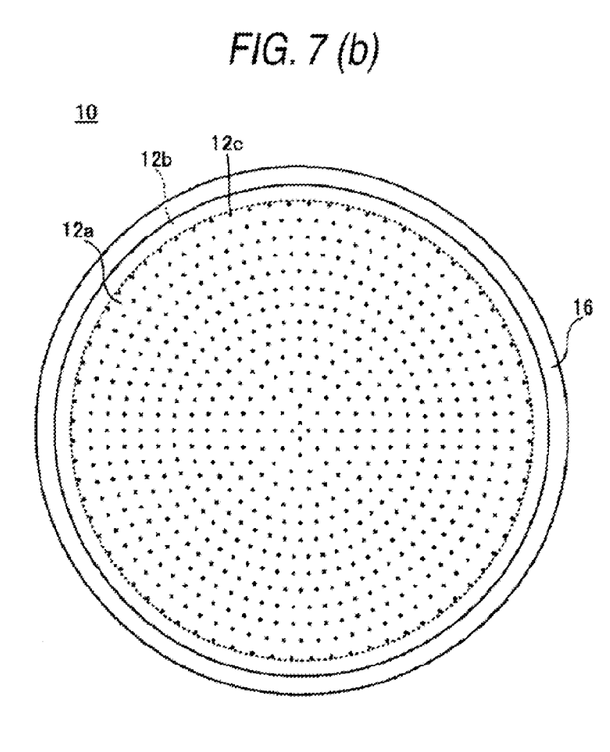

FIGS. 7(a) and 7(b) are top views showing the substrate temperature adjusting-fixing devices 100 and 10. FIG. 7(a) is a top view showing the substrate temperature adjusting-fixing device 100 according to the conventional art, and FIG. 7(b) is a top view showing the substrate temperature adjusting-fixing device 10 according to the invention. In the same drawing, the same reference numerals are given to the same components of FIGS. 1 and 4, and the description thereof will be omitted. Additionally, since FIGS. 7(a) and 7(b) are used to describe the protrusion portion, the gas discharge portions 108b and 18b are omitted.

As shown in FIGS. 7(a) and 7(b), the plurality of cylindrical protrusion portions 102c and 12c are provided in the upper surfaces 102a and 12a of the base bodies 102 and 12 so as to be dotted in a polka-dot pattern in a top view. Additionally, in the substrate temperature adjusting-fixing device 100 according to the conventional art shown in FIG. 7(a), as described above, the outer edge portion of the upper surface 102a of the base body 102 is provided with the outer peripheral seal ring 102b as the annular protrusion portion in a top view. In the substrate temperature adjusting-fixing device 10 according to the invention shown in FIG. 7(b), as described above, the outer edge portion 12b of the upper surface 12a of the base body 12 is not provided with the outer peripheral seal ring 102b. Additionally, the diameter $\phi_2$ of the upper surface of the protrusion portion 12c of the substrate temperature adjusting-fixing device 10 according to the invention is smaller than the diameter $\phi_1$ of the upper surface of the protrusion portion 102a of the substrate temperature adjusting-fixing device 100 according to the conventional art.

FIGS. 8(a) and 8(b) are schematic views showing the particles 200 and 20 attached to the opposite surfaces of the substrates 107 and 17 in the case where the substrates 107 and 17 are placed on the substrate temperature adjusting-fixing devices 100 and 10 shown in FIGS. 7(a) and 7(b). FIG. 8(a) is a schematic view showing the particles 200 attached to the opposite surface of the substrate 107 in the case where the substrate 107 is placed on the substrate temperature adjusting-fixing device 100 according to the conventional art. FIG.

8(*b*) is a schematic view showing the particles 20 attached to the opposite surface of the substrate 17 in the case where the substrate 17 is placed on the substrate temperature adjusting-fixing device 10 according to the invention.

Figure 8:
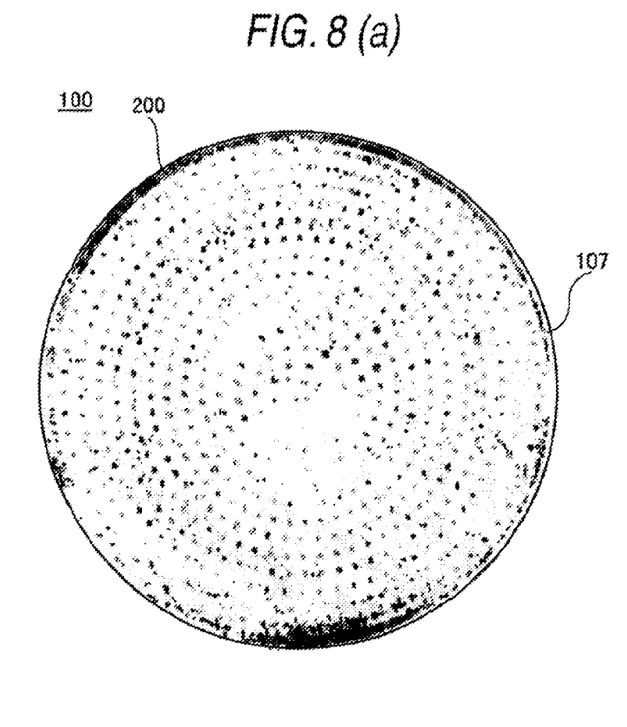
FIGS. 8(a) and 8(b) are schematic views showing particles 200 and 20 attached to the opposite surfaces of the substrates 107 and 17 in the case where the substrates 107 and 17 are placed on the substrate temperature adjusting-fixing devices 100 and 10 shown in FIGS. 7(a) and 7(b).

As shown in FIG. 8(*a*), when the substrate 107 is placed on the substrate temperature adjusting-fixing device 100 according to the conventional art, the particles 200 are attached to the opposite surface of the substrate 107 at a portion contacting with the outer peripheral seal ring 102*b* and the plurality of protrusion portions 102*c*. Particularly, the particles 200 are intensively attached to a portion contacting with the outer peripheral seal ring 102*b*.

On the other hand, as shown in FIG. 8(*b*), when the substrate 17 is placed on the substrate temperature adjusting-fixing device 10 according to the invention, since the substrate temperature adjusting-fixing device 10 is not provided with the outer peripheral seal ring 102*b*, the particles 20 are not intensively attached to the outer edge portion of the opposite surface of the substrate 17. Additionally, since the diameter $\phi_2$ of the upper surface of the protrusion portion 12*c* of the substrate temperature adjusting-fixing device 10 is smaller than the diameter $\phi_1$ of the upper surface of the protrusion portion 102*a* of the substrate temperature adjusting-fixing device 100, it is possible to remarkably reduce the particles 20 attached to the opposite surface of the substrate 17.

With the substrate temperature adjusting-fixing device 10 according to the invention, since the outer seal ring 102*b* is not provided in the outer edge portion 12*b* of the upper surface 12*a* of the base body 12 and the diameter $\phi_2$ of the upper surface of the protrusion portion 12*c* is remarkably smaller than that of the conventional art, it is possible to remarkably decrease the contact area between the substrate 17 and the upper surface of the protrusion portion 12*c* and thus to remarkably reduce the particles 20 attached to the whole opposite surface of the substrate 17 including the outer edge portion.

While the exemplary embodiments of the invention have been described in detail, the invention is not limited to the above-described embodiments, but various modifications and substitutions of the above-described embodiments can be made without departing from the scope of the invention.

What is claimed is:

1. An electrostatic chuck comprising:
a base body, and
an electrostatic electrode embedded in the base body, wherein
an adsorption object is placed on the base body,
a coulombic force is generated between the adsorption object and the electrostatic electrode by applying a voltage to the electrostatic electrode so as to hold the adsorption object in an adsorption state,
the base body includes: an upper surface of the base body opposed to the adsorption object, and a plurality of protrusions extending from the upper surface of the base body at a protrusion portion of the upper surface of the base body, the plurality of protrusions adapted to come into contact with the adsorption object, said plurality of protrusions including a plurality of outermost protrusions disposed along a periphery of the protrusion portion of the upper surface of the base body, each of the plurality of outermost protrusions being spaced from one another, wherein the upper surface of the base body also includes a protrusion-free outer edge portion entirely formed in substantially a same plane as the upper surface of the base body at the protrusion portion, the protrusion-free outer edge portion bounded at an outer end by an outermost edge of the upper surface of the base body, and at an inner end by an outermost point of each of the plurality of outermost protrusions, the protrusion-free outer edge portion surrounding the protrusion portion of the upper surface of the base body and the plurality of protrusions, wherein
said protrusion-free outer edge portion is configured such that, upon generation of the coulombic force between the adsorption object and the electrostatic electrode, a peripheral portion of the adsorption object bends toward a perimeter of the protrusion-free outer edge portion and an outer edge portion of a lower surface of the adsorption object contacts the protrusion-free outer edge portion so as to define a substantially enclosed space between the base body and the adsorption object.

2. The electrostatic chuck according to claim 1, wherein
each of the plurality of protrusions is a substantially cylindrical member which protects from the upper surface of the base body, and each of the plurality of protrusions are spaced from one another such that the plurality of protrusions define a dotted pattern in a top view.

3. The electrostatic chuck according to claim 1, wherein
when the adsorption object is held in an adsorption state, the generated coulombic force causes an outer edge portion of the lower surface of the adsorption object to contact the protrusion-free outer edge portion of the upper surface of the base body.

4. The electrostatic chuck according to claim 1, wherein
an inert gas of which a pressure is adjusted is filled into a space formed between a lower surface of the adsorption object held in an adsorption state and the upper surface of the base body.

5. A substrate temperature adjusting-fixing device comprising:
the electrostatic chuck according to claim 1, and
a base plate for supporting the electrostatic chuck.

6. The substrate temperature adjusting-fixing device according to claim 5, wherein
the base plate comprises:
a gas path embedded therein so as to introduce the inert gas into the electrostatic chuck, and
a water path embedded therein so as to cool the electrostatic chuck.

7. The electrostatic chuck according to claim 1, wherein the base body is configured to permit a gas to be injected into the substantially enclosed space between the protrusion-free outer edge portion of the base body and the adsorption object when the coulombic force is generated.

8. The electrostatic chuck according to claim 1, wherein
the protrusion-free outer edge portion has a width such that the generated coulombic force causes the outer edge portion of the lower surface of the adsorption object to contact the protrusion-free outer edge portion of the upper surface of the base body.

9. The electrostatic chuck according to claim 1, wherein said protrusion portion has an upper surface configured to come into contact with the adsorption object, said protrusion portion upper surface spaced from the upper surface of the base body by a distance greater than 3 μm and less than 5 μm.

10. The electrostatic chuck according to claim 1, wherein the electrostatic electrode embedded in the base body extends to a position of the base body which is overlayed by the protrusion-free outer edge portion.

11. The electrostatic chuck according to claim 2, wherein the protrusion-free outer edge portion has an annular shape, and each of the plurality of outermost protrusions are provided such that the outermost point of each of the outermost protrusions is disposed at the inner end of the annular-shaped protrusion-free outer edge portion.

12. The electrostatic chuck according to claim 1, wherein the upper surface of the base body defines a planar surface having only the plurality of protrusions projecting therefrom.

13. The electrostatic chuck according to claim 2, wherein the upper surface of the base body defines a planar surface having only the plurality of protrusions projecting therefrom.

14. The electrostatic chuck according to claim 11, wherein the upper surface of the base body defines a planar surface having only the plurality of protrusions projecting therefrom.

15. The electrostatic chuck according to claim 1, wherein the upper surface of the base body at the protrusion portion is contiguous with the upper surface of the base body at the protrusion-free outer edge portion.

16. The electrostatic chuck according to claim 1, wherein the base body includes a gas discharge opening through which an inert gas of which a pressure is adjusted may be filled into a space formed between a lower surface of the adsorption object held in an adsorption state and the upper surface of the base body, said gas discharge opening formed only in the protrusion portion of the upper surface of the base body, and wherein the plurality of protrusions are disposed such that the gas which filled through the gas discharge opening formed only in the protrusion portion of the upper surface of the base body flows to the protrusion-free outer edge portion.

* * * * *